United States Patent
Goerlach et al.

(10) Patent No.: US 9,142,552 B2
(45) Date of Patent: Sep. 22, 2015

(54) SEMICONDUCTOR ARRAY HAVING TEMPERATURE-COMPENSATED BREAKDOWN VOLTAGE

(71) Applicants: Alfred Goerlach, Kusterdingen (DE); Ning Qu, Reutlingen (DE)

(72) Inventors: Alfred Goerlach, Kusterdingen (DE); Ning Qu, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/504,965

(22) Filed: Oct. 2, 2014

(65) Prior Publication Data
US 2015/0091125 A1  Apr. 2, 2015

(30) Foreign Application Priority Data
Oct. 2, 2013  (DE) .......................... 10 2013 220 011

(51) Int. Cl.
| H01L 27/06 | (2006.01) |
|---|---|
| H01L 29/66 | (2006.01) |
| H01L 29/872 | (2006.01) |
| H01L 29/06 | (2006.01) |
| H01L 29/16 | (2006.01) |
| H01L 29/73 | (2006.01) |
| H01L 29/732 | (2006.01) |

(52) U.S. Cl.
CPC ........ *H01L 27/0664* (2013.01); *H01L 29/0615* (2013.01); *H01L 29/16* (2013.01); *H01L 29/66143* (2013.01); *H01L 29/7302* (2013.01); *H01L 29/732* (2013.01); *H01L 29/872* (2013.01); *H01L 29/8725* (2013.01)

(58) Field of Classification Search
CPC ............ H01L 29/66143; H01L 29/872; H01L 29/8725
See application file for complete search history.

(56) References Cited

U.S. PATENT DOCUMENTS

| 6,191,447 B1 * | 2/2001 | Baliga ........................... 257/330 |
|---|---|---|
| 8,704,295 B1 * | 4/2014 | Darwish et al. ............... 257/330 |
| 8,836,072 B2 * | 9/2014 | Qu et al. ........................ 257/476 |
| 2003/0006473 A1 * | 1/2003 | Rodov et al. .................. 257/493 |
| 2005/0242411 A1 * | 11/2005 | Tso ................................ 257/480 |
| 2012/0256196 A1 * | 10/2012 | Qu et al. .......................... 257/77 |
| 2014/0048847 A1 * | 2/2014 | Yamashita et al. ............ 257/140 |
| 2014/0252463 A1 * | 9/2014 | Darwish et al. ............... 257/330 |

FOREIGN PATENT DOCUMENTS

| DE | 19549202 | 7/1997 |
|---|---|---|
| DE | 102004053760 | 5/2006 |
| DE | 102004056663 | 6/2006 |

* cited by examiner

*Primary Examiner* — Eugene Lee
(74) *Attorney, Agent, or Firm* — Kenyon & Kenyon LLP

(57) ABSTRACT

A semiconductor array is described whose breakdown voltage has only a very low temperature coefficient or none at all and therefore there is little or no temperature-dependent voltage rise. The voltage limitation is achieved by a punch-through effect.

5 Claims, 2 Drawing Sheets

SEMICONDUCTOR ARRAY HAVING TEMPERATURE-COMPENSATED BREAKDOWN VOLTAGE

BACKGROUND INFORMATION

AC bridges (rectifiers) are used for rectification of three-phase or AC automotive generators (dynamos). Semiconductor diodes having a pn junction of silicon are generally used as rectifying elements. For example, six semiconductor diodes are wired together to form a B6 bridge in a three-phase generator. Diodes are occasionally also used in parallel circuits, using twelve diodes instead of six, for example. Suitably adapted diode bridges are also used in AC generators having a different number of phases.

These diodes are designed for operation at high currents or current densities of more than 500 A/cm$^2$ and high temperatures or a maximum barrier layer temperature Tj of approximately 225° C. The voltage drop in the forward direction, i.e., forward voltage UF, typically amounts to about 1 volt at the high currents used. Generally only a very low reverse current IR flows during operation in the reverse direction below breakdown voltage UZ. The reverse current increases drastically beyond breakdown voltage UZ. A further increase in voltage is therefore prevented. Z diodes having reverse voltages of approximately 20-50 volts, depending on the vehicle electrical system voltage of the particular motor vehicle, are used in most cases. Z diodes are capable of carrying high currents briefly in a breakdown. They are therefore used to limit the overshooting generator voltage in load changes (load dump). Such diodes are generally packaged in sturdy press-fit diode housings such as those described in DE 195 49 202 B4, for example.

The forward voltage of pn diodes results in forward power losses and thus has a negative effect on the efficiency of the generator. On the average, two diodes are always connected in series in current output by the generator, so the average forward power losses with a 100 A generator amount to approximately 200 W. These losses result in heating of the diodes. The resulting heat must be dissipated to the ambient air or cooling air through complex cooling measures involving the rectifier, for example, using cooling elements and/or a fan.

German Published Patent Application No. 10 2004 056 663 describes the use of so-called high-efficiency Schottky diodes (HED) instead of pn diodes to reduce the forward power losses. High-efficiency Schottky diodes are diodes having a low forward voltage and a reverse current almost independent of the reverse voltage.

German Published Patent Application No. 10 2004 053 760 describes a trench MOS barrier Schottky diode, including an integrated pn diode, as one possible exemplary embodiment of an HED Schottky diode. Such a diode is also known as a TJBS-PN. In addition to the low forward voltage in the conducting state, this also limits the overshooting generator voltage, which may occur with sudden load changes, to uncritical values, typically to voltages of less than 30 V in 14 V systems.

Much lower forward voltages UF in the range of 0.5 V to 0.7 V are achievable using high-efficiency Schottky diodes. The efficiency and power output of the generator are increased due to the low forward power losses of these diodes. The expenditure for cooling may also be reduced substantially in comparison with the use of pn diodes due to the lower power losses.

Due to the breakdown voltage of an HED, the generator voltage, which rises when a load dump occurs, is limited. High electric powers are converted into heat on the diode for a short period of time, typically less than a few 100 milliseconds. In the case of a TJBS-PN, the integrated pn structures act as voltage-limiting Z diodes. The pn structures are operated in avalanche breakdown. The power drop at the diode corresponds to the product of the reverse voltage of the diode and the generator current. Due to the high power loss, the diode heats up to very high temperatures during this process. Barrier layer temperatures or junction temperatures Tj of more than 225° C. may occur. Since the avalanche breakdown voltage VZ increases with the temperature, the voltage actually occurring during the load dump is a few volts higher than reverse voltages VZ measured at low current densities and at room temperature. As a result, in the event of a breakdown, voltages of more than 30 volts may occur briefly in a 14 V vehicle electrical system. A simple drop in breakdown voltage VZ finds its limit in the voltage ripple of the generators (ripple). In modern vehicle electrical system architectures, there is a growing trend toward limiting the maximum occurring vehicle electrical system voltage to low levels, for example, to 27 V, in the event of a malfunction.

SUMMARY

A semiconductor array according to the present invention, which is also referred to below as a TJBS-PT (trench junction barrier Schottky-punch through diode), corresponds to a high-efficiency Schottky diode, whose breakdown voltage has a very low temperature coefficient or none at all and in which the temperature-induced voltage rise therefore occurs only to a slight extent or not at all.

This TJBS-PT is a high-efficiency diode having a low forward voltage and low reverse currents, based on a trench junction barrier Schottky diode, in which the voltage is limited by a punch-through effect instead of by the temperature-dependent avalanche defect. The breakdown voltage is therefore almost independent of temperature. The semiconductor array according to the present invention is preferably packed into a press-fit diode housing and used for efficient rectification in automotive AC generators. It is therefore possible to reduce the maximum voltage occurring in the vehicle electrical system in the event of a malfunction.

DETAILED DESCRIPTION

Figure 1:
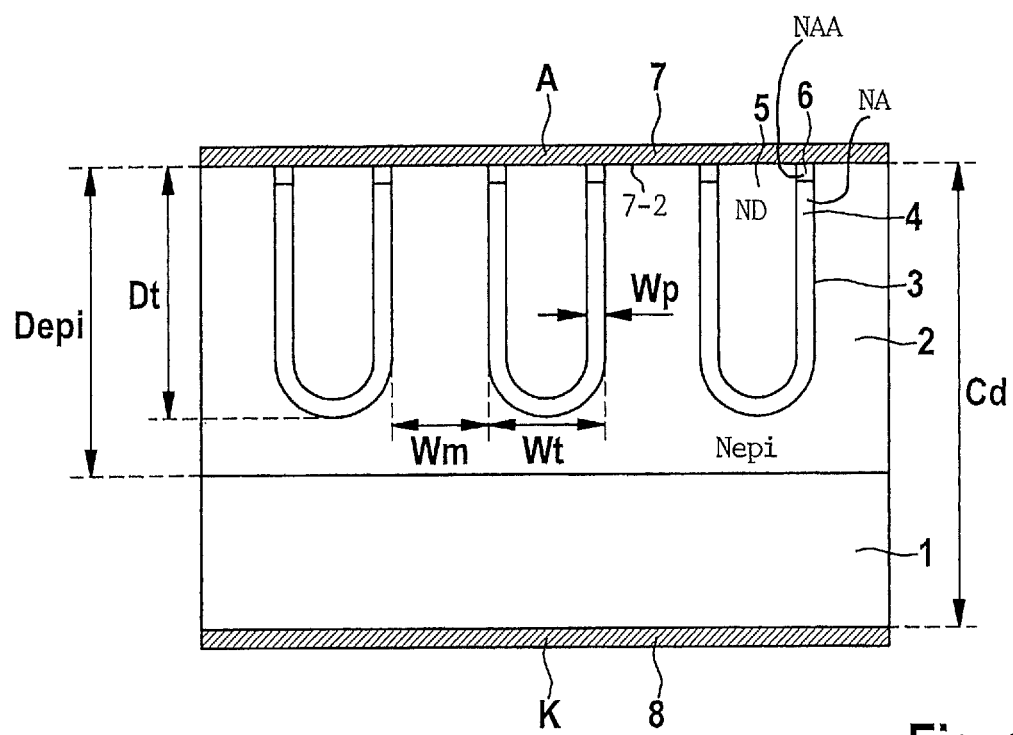
FIG. 1 shows a cross-sectional diagram to illustrate a cell of a TJBS-PT according to one first exemplary embodiment of the present invention.

FIG. 1 shows a cross-sectional diagram to illustrate one cell of a TJBS-PT according to a first exemplary embodiment of the present invention. The TJBS-PT shown here has a highly n+-doped silicon substrate 1, whose doping is preferably greater than $5 \cdot 10^{19}$ cm$^{-3}$. This silicon substrate 1 has an n-doped silicon layer 2 (epi layer) having a doping concentration Nepi and a thickness Depi, into which a plurality of trenches 3 having a depth Dt and a width Wt have been introduced. The trench bottoms are preferably designed to be rounded. A rounding radius R may be set approximately.

Trench depth Dt is then defined as the distance between the silicon surface and the deepest point in the trenches. Let the distance between neighboring trenches be Wm. The trenches may be in the form of islands, strips or some other shape. The side walls of trenches 3 etched into the silicon are covered with a thin p-doped silicon layer 4 having a doping concentration NA and a thickness Wp. The interior of trenches 3 is filled with highly n-doped silicon 5 having a doping concentration ND. Furthermore, a highly p-doped layer 6 having a higher doping concentration NAA than doping concentration NA of layer 4 is introduced into the upper part of p-layers 4. In particular, the surface concentration of layer 6 is selected to be so high that it forms an ohmic contact with a metal layer 7 above it. The p- and n-doped regions 4 and 5 or 6 may be either epitactically grown silicon, polysilicon or a combination thereof. Metal layer 7 covering the surface of the array forms a Schottky contact with the surface of epi layer 2 and forms an ohmic contact with n- and p-doped layers 5 and 6, respectively. For example, metal layer 7 may be made of nickel or a nickel silicide. Other metals or silicides are also possible, depending on the desired height of the barrier. Additional metal layers, not shown in FIG. 1, may also be provided above metal layer 7. These metal layers form anode A of the diode. Substrate layer 1 is provided with an ohmic metal layer 8, which functions as cathode K on the rear side. Again, additional metal layers, not shown in FIG. 1, may be situated beneath layer 8. In addition, the front and rear sides are each to be provided with a solderable layer system for packing into press-fit diode housings. For example, a conventional solderable metal system including a layer sequence of Cr, NiV and Ag, also not shown, is applied to the front and rear sides over metal layers 7 and 8. Additional metal layers may be provided between layer 7 and the solderable NiV layer, in particular on the front side, for example, an aluminum alloy (AlSiCu) such as that customary in silicon technology, containing copper and silicon components or some other metal system, for example, AlCu, over a thin barrier layer of TaN.

Figure 2:
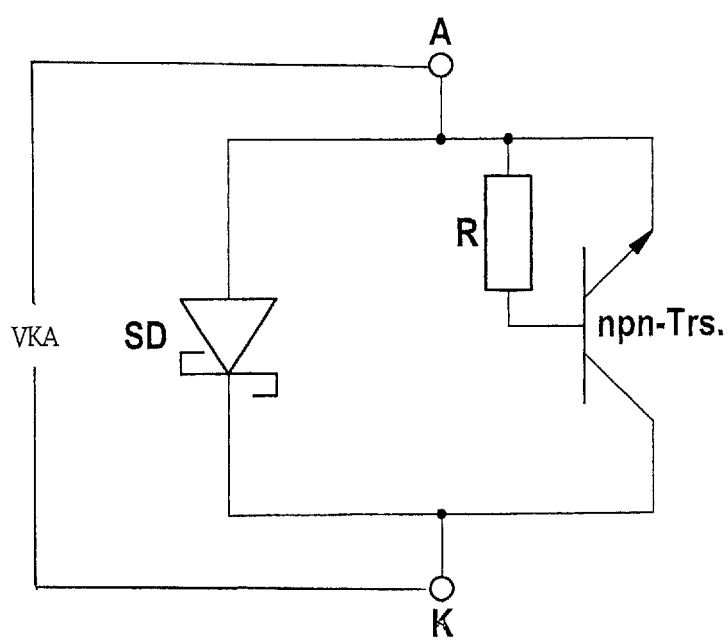
FIG. 2 shows a simple equivalent circuit diagram of a TJBS-PT.

The array according to the present invention may be interpreted as a parallel circuit of Schottky diodes and npn transistor structures, as illustrated in FIG. 2, where the Schottky diodes are formed by barrier metal 7 and n-doped epi layer 2. Layers 5, 4 and 2 form the emitter, the base and the collector of the npn transistor structures. The base is connected electrically to the anode or emitter metallization 7 across resistor R of p-doped layer 4 and highly p-doped layer 6. The transistor region on the trench bottom is provided with the greatest base resistance R. In the upper part, however, close to metallization 7, the base is actually short-circuited to the emitter.

In forward polarization, current flows off to the cathode via the Schottky barrier in epi layer 2 between trench regions 3 over substrate 1. The forward voltage may have a lower value than is the case with a pn diode due to the choice of a suitable barrier. No noteworthy current flows through the transistor structures in the trenches.

When a reverse voltage VKA is applied, space charge zones develop in the Schottky diode as well as in the npn transistor. The electric field on metal semiconductor contact 7-2 is shielded due to the fact that space charge zones propagate from the opposing trench walls and finally come into contact with each other. The electric field strength at the Schottky contact is therefore lower. The Schottky diodes therefore have little or no barrier-lowering behavior. The Schottky diode thus acts like a TMBS diode or a TJBS diode, in which the reverse current increases only slightly with an increase in the reverse voltage. In npn transistor substructures, the base-collector junction is polarized in the reverse direction when VKA is applied.

In npn transistors, the space charge zone expands mainly in more weakly n-doped region 2 but also extends into more strongly p-doped base region 4. The electric fields and extents of the space charge zones at the npn transistors are at the maximum at the trench bottom, in particular in the curved region.

Breakdown voltage BVCER between the collector and emitter having resistor R between the base and emitter of a bipolar transistor is lower than avalanche breakdown voltage BVCBO of the collector-base diode because of its current gain. The breakdown voltage will usually have a positive temperature coefficient if the breakdown voltage of the collector-base diode is determined by the avalanche effect. A slightly negative-to-neutral temperature coefficient of the BVCER voltage is achievable if the diffusion profile of the transistors is designed in such a way that the space charge zone extends through base region 4, even before achieving the avalanche breakdown voltage, and abuts against emitter region 5 (punch-through), thus limiting the voltage.

The dopings and dimensions of the semiconductor layers are designed in such a way that the breakdown voltage of the collector-base junction of the npn transistor formed from layers 2 and 4 is limited by the punch-through effect. Punch-through refers to the state in which the space charge zone of the collector-base junction polarized in the reverse direction extends completely through base layer 4 and abuts against emitter layer 5. When the space charge zone has reached the emitter layer, current flows after overcoming another low voltage, which corresponds approximately to a forward voltage or diffusion voltage of a diode. No further voltage increase is then possible. Since the voltage limitation has virtually no dependence on temperature, in contrast with an avalanche breakdown, the breakdown voltage of an array according to the present invention does not increase with an increase in spontaneous heating.

Since the emitter-base diode is operated more or less in the forward direction, punch-through breakdowns at low currents even have a slightly negative temperature coefficient of the breakdown voltage. At high current densities and high temperatures, electron mobility decreases slightly, and for charge carriers in the space charge zone, the saturation rate drops slightly, so that temperature compensation for the reverse voltage is almost achievable.

The transition between avalanche operation and punch-through operation may be influenced through the choice of base doping NA and thickness Wp of p-doped silicon layer 4. At a fixed thickness Wp, the avalanche effect increases with an increase in base doping NA, i.e., there is an increasingly positive temperature coefficient. The effects may be combined through a suitable choice of parameters, in such a way that the breakdown voltage becomes completely independent of temperature.

The following shows a design example for an array according to FIG. 1 having a reverse voltage of approximately 24.5 V at high current densities of approximately 400 A/cm². The temperature coefficient here is almost zero between 25° C. and 200° C. According to this design example, the parameters are selected as follows:

chip thickness: Cd=200 μm;
substrate doping: Nsub≥1·10$^{19}$ cm$^{-3}$;
doping concentration of epi layer 2: Nepi=2.86·10$^{16}$ cm$^{-3}$;
thickness of epi layer: Depi=2 μm;
depth of trenches 3: Dt=1 μm. Dt includes a rounding radius at trench bottom of R=0.4 μm;
width of trenches: Wt=1 μm;

Rounding radius at trench bottom R=0.4 µm;
doping of the n trench filling: ND=5·10$^{19}$ cm$^{-3}$;
doping of the p layer at the edge of trench: NA=2.7·10$^{17}$ cm$^{-3}$;
width of the p layer at the edge of trench: Wp=0.2 µm;
increased doping of the p layer: NAA>5·10$^{18}$ cm$^{-3}$, for example 5·10$^{19}$ cm$^{-3}$.

Designs for other reverse voltages may of course also be found. Dopings and geometric dimensions may therefore be varied within a wide range. Furthermore, doping profiles which do not have constant doping but instead have a certain doping profile may also be selected. Furthermore, arrays in which n- and p-doped regions are switched may also be used.

Figure 3:
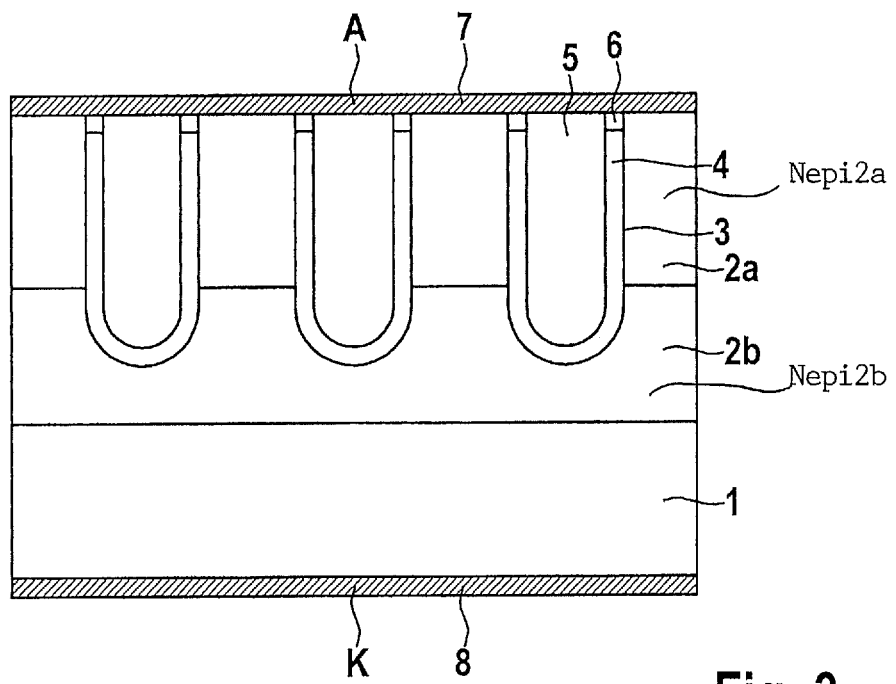
FIG. 3 shows a cross-sectional diagram to illustrate a cell in a TJBS-PT according to a second exemplary embodiment of the present invention.

FIG. 3 shows another exemplary embodiment having low reverse currents in particular. In contrast with FIG. 1, n-doped layer 2 includes two different layers 2a and 2b having an altered thickness and different doping. Doping concentration Nepi2a of upper layer 2a is selected to be lower than doping concentration Nepi2b of lower layer 2b. Lower doping concentration Nepi2b may be approximately as high as doping concentration Nepi from the first exemplary embodiment, for example. Layer 2b may be created with the aid of ion implantation of donors in an epi layer having doping concentration Nepi2a, followed by diffusion. The doping concentration and thus the desired reverse voltage may therefore be adjusted with a high precision.

Figure 4:
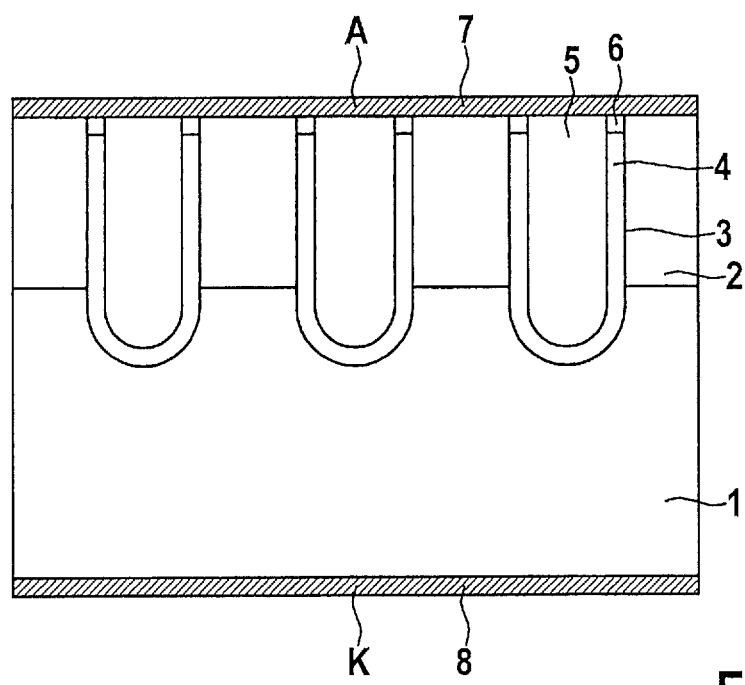
FIG. 4 shows a cross-sectional diagram to illustrate a cell of a TJBS-PT according to a third exemplary embodiment of the present invention.

FIG. 4 shows another exemplary embodiment having low reverse currents. Trenches 3 extend into highly doped substrate 1. The functioning of the array shown here is similar to that of the array according to FIG. 2.

The n- and p-doped layers 5 and 4, respectively, may be made of doped polysilicon or epitaxially grown layers. It is also possible to create p-doped layers 4 by diffusion of acceptors from the trench surface into n-doped epi region 2 and to generate the n-doped layer again by deposition of polysilicon or epitactic growth.

What is claimed is:

1. A semiconductor array, comprising:
    a first metal layer arranged as a cathode;
    a highly n-doped silicon layer contacted with the first metal layer;
    an additional n-doped silicon layer contacted with the highly n-doped silicon layer; and
    an additional metal layer connected to the additional n-doped silicon layer and arranged as an anode, wherein:
        trenches are introduced into the additional n-doped silicon layer, the trenches having edge regions filled with a p-doped silicon layer, the trenches each having an interior region filled with highly n doped silicon, wherein a doping concentration of the p-doped edge regions of the trenches is lower than a doping concentration of the n-doped interior regions of the trenches,
        the edge regions of the trenches are contacted with the additional metal layer via a highly p-doped layer that forms an ohmic contact with the additional metal layer,
        the additional metal layer forms Schottky diodes with the additional n-doped layer,
        the highly n-doped interior regions of the trenches form npn transistors together with the edge regions of the trenches and the additional n-doped layer,
        the additional n-doped silicon layer is arranged as a collector region, the highly n-doped interior regions of the trenches are arranged as emitter regions,
        the edge regions of the trenches function as base regions, and
        a limitation of reverse voltages for diode-forming collector-base junctions is determined by a punch-through effect.

2. The semiconductor array as recited in claim 1, wherein the additional n-doped silicon layer is divided into two differently doped regions, one region being contacted with the additional metal layer and the other region being contacted with the highly n-doped silicon layer.

3. The semiconductor array as recited in claim 2, wherein a doping concentration of the region contacted with the additional metal layer is lower than a doping concentration of the region contacted with the highly n-doped silicon layer.

4. The semiconductor array as recited in claim 2, wherein the trenches end in the region contacted with the highly n-doped silicon layer.

5. The semiconductor array as recited in claim 1, wherein the trenches end in the highly n-doped silicon layer.

* * * * *